United States Patent
Lin

(10) Patent No.: US 10,833,105 B2
(45) Date of Patent: Nov. 10, 2020

(54) DISPLAY DEVICE AND METHOD OF MANUFACTURING DISPLAY PANEL

(71) Applicants: HKC CORPORATION LIMITED, Shenzhen, Guangdong (CN); CHONGQING HKC OPTOELECTRONICS TECHNOLOGY CO., LTD., Chongqing (CN)

(72) Inventor: Peihsin Lin, Chongqing (CN)

(73) Assignees: HKC CORPORATION LIMITED, Shenzhen (CN); CHONGQING HKC OPTOELECTRONICS TECHNOLOGY CO., LTD., Chongqing (CN)

( * ) Notice: Subject to any disclaimer, the term of this patent is extended or adjusted under 35 U.S.C. 154(b) by 0 days.

(21) Appl. No.: 16/315,208

(22) PCT Filed: Dec. 21, 2018

(86) PCT No.: PCT/CN2018/122791
§ 371 (c)(1),
(2) Date: Jan. 4, 2019

(87) PCT Pub. No.: WO2020/024533
PCT Pub. Date: Feb. 6, 2020

(65) Prior Publication Data
US 2020/0043960 A1  Feb. 6, 2020

(30) Foreign Application Priority Data

Aug. 3, 2018  (CN) .......................... 2018 1 0879046

(51) Int. Cl.
*H01L 27/12* (2006.01)

(52) U.S. Cl.
CPC ........ *H01L 27/1262* (2013.01); *H01L 27/124* (2013.01); *H01L 27/127* (2013.01); *H01L 27/1222* (2013.01)

(58) Field of Classification Search
CPC ...... H01L 21/027; H01L 21/31; H01L 21/469
See application file for complete search history.

(56) References Cited

U.S. PATENT DOCUMENTS

| | | | |
|---|---|---|---|
| 2006/0110912 A1* | 5/2006 | Lu | ..................... H01L 21/76802 438/624 |
| 2008/0079115 A1* | 4/2008 | Wang | ..................... H01L 24/06 257/531 |

(Continued)

OTHER PUBLICATIONS

Darling, "EE-527: MicroFabrication Photolithography," Winter 2013. Retrieved from https://labs.ece.uw.edu/cam/tutorials/Photolithography.pdf on Dec. 27, 2019. (Year: 2013).*

*Primary Examiner* — Jay C Chang
*Assistant Examiner* — Mikka Liu

(57) ABSTRACT

A display device and a method of manufacturing a display panel are provided. A first metal layer is provided on a substrate, an insulating layer is provided on the first metal layer with the insulating layer covering the substrate, the active layer is provided on the substrate, a second metal layer is provided on the active layer, and a passivation layer is provided on the second metal layer with the passivation layer covering the active layer. The material of passivation layer is comprises low dielectric material such that the provided passivation layer has a low dielectric constant.

17 Claims, 6 Drawing Sheets

(56) References Cited

U.S. PATENT DOCUMENTS

2017/0149001 A1* 5/2017 Kleemann ............. H01L 51/057
2018/0197887 A1* 7/2018 Liu ........................ H01L 21/77

* cited by examiner

DISPLAY DEVICE AND METHOD OF MANUFACTURING DISPLAY PANEL

CROSS-REFERENCES TO RELATED DISCLOSURE

This application is the International Application No. PCT/CN2018/122791 for entry into US national phase with an international filing date of Dec. 21, 2018 designating US, and claims priority to Chinese Patent Application No. 2018108790463, filed with the Chinese Patent Office on Aug. 3, 2018 and entitled "DISPLAY DEVICE AND METHOD OF MANUFACTURING DISPLAY PANEL", which is incorporated herein by reference in its entirety.

BACKGROUND

Technical Field

The present disclosure relates to the technical field of display technologies, and in particular, to a display device and a method of manufacturing display panel.

Related Art

In an active matrix liquid crystal display, each pixel includes a thin film transistor (TFT), where the gate of the thin film transistor is connected to a horizontal scanning line, the source is connected to a vertical data line, and the drain is connected to the electrode of the pixel. If a certain horizontal scanning line provides enough positive voltage, all the thin film transistors connected to the scanning line are turned on, and the pixel electrodes of the scanning line are conducted with the vertical data lines, so that the signal voltages of the data lines are written into each pixel capacitor of the corresponding scanning lines to control the transmittance of the liquid crystal layer of different pixels so as to achieve color control.

The gate drive circuit for driving the gate of the thin film transistor of each pixel uses a shift register (SR) to generate continuous driving signals to the scanning line to control the turn-on and the turn-off of the thin film transistor of each pixel in the display. In the current technology, the shift register is directly formed on an array substrate to replace a driver chip made by an externally connected silicon chip. This technology is also referred to as gate driver on array (GOA). Further, directly forming the shift register on the border of the display panel can reduce the production processes and the product cost, thereby improving the high integration of the active matrix panel and making the panel thinner.

The process architecture of the display panel can be, based on the gate drive design, divided into system on chip (SOC) and GOA. From the point of view of the demand for the product, a small frame is also expected by everyone. Compared with the SOC architecture, the GOA architecture has a smaller border. GOA is an important technology in panel design, its main advantage is that the gate drive integrated circuit can be eliminated and the product cost can be reduced. Therefore, GOA products are bound to be the mainstream trend in the future. So how to solve the problem of excessive circuit load is a major challenge for GOA products currently on the market.

SUMMARY

An object of the present disclosure is to provide a method of manufacturing a display panel to solve the problem, including but not limited to, that the circuit load is excessive.

In the technical solutions adopted by embodiments of the present application, a method of manufacturing a display panel is provided, which includes:

providing a substrate;
providing a first metal layer on the substrate;
providing an insulating layer on the first metal layer, wherein the insulating layer covers the substrate;
providing an active layer on the insulating layer;
providing a second metal layer on the active layer; and
providing a passivation layer on the second metal layer, wherein the passivation layer covers the active layer;
where the material of the passivation layer is comprises low dielectric material.

In an embodiment of the present disclosure, the low dielectric material is a material selected from a group consisting of pure inorganic material, pure organic material and inorganic-organic hybrid material.

In an embodiment of the present disclosure, the low dielectric material is a material selected from a group consisting of ceramic material and silica based material.

In an embodiment of the present disclosure, the passivation layer has a thickness ranging from 2,300 μm to 20,000 μm.

In an embodiment of the present disclosure, the active layer is a layer selected from a group consisting of amorphous silicon layer, polysilicon layer and metal oxide semiconductor layer.

In an embodiment of the present disclosure, the passivation layer is provided by using a yellow light process.

In an embodiment of the present disclosure, the step of providing the passivation layer by using a yellow light process includes: providing a low dielectric material layer on the second metal layer and the active layer, coating photoresist on the low dielectric material layer, exposing and developing the photoresist by using a photomask to obtain a photoresist layer, and using the photoresist layer as a barrier layer to etch the low dielectric material layer to obtain the passivation layer.

In an embodiment of the present disclosure, the low dielectric material layer is provided by a method selected from a group consisting of physical vapor deposition method, chemical vapor deposition method, coating method and evaporation method.

In an embodiment of the present disclosure, the low dielectric material layer is etched by dry etching or wet etching so as to obtain the passivation layer.

Another object of the present disclosure is to provide a method of manufacturing a display panel which includes:

providing a substrate;
providing a first metal layer on the substrate;
providing an insulating layer on the first metal layer, where the insulating layer covers the substrate;
providing an active layer on the insulating layer;
providing a second metal layer on the active layer; and
providing a passivation layer on the second metal layer, where the passivation layer covers the active layer;
where the material of the passivation layer is comprises low dielectric material, the low dielectric material is a material selected from a group consisting of ceramic material and silica based material, the passivation layer has a thickness ranging from 2,300 μm to 20,000 μm, the active layer is a layer selected from a group consisting of amorphous silicon layer, polysilicon layer and metal oxide semiconductor layer, the passivation layer is provided by using a yellow light process which comprises: providing a low dielectric material layer on the second metal layer and the active layer by a method selected from a group consisting of physical vapor deposition method, chemical vapor deposition method, coating method and evaporation method, coating photoresist on the low dielectric material layer, exposing and developing the photoresist by using a photomask to obtain a photoresist layer, and using the photoresist layer as a barrier layer to etch the low dielectric material layer by dry etching or wet etching to obtain the passivation layer.

Yet another object of the present disclosure is to provide a display device which includes:

a substrate;

a first metal layer provided on the substrate;

an insulating layer provided on the first metal layer, wherein the insulating layer covers the substrate;

an active layer provided on the insulating layer;

a second metal layer provided on the active layer; and a passivation layer provided on the second metal layer, wherein the passivation layer covers the active layer;

where the material of passivation layer is comprises low dielectric material.

In an embodiment of the present disclosure, the low dielectric material is a material selected from a group consisting of ceramic material and silica based material.

In an embodiment of the present disclosure, the active layer is a layer selected from a group consisting of amorphous silicon layer, polysilicon layer and metal oxide semiconductor layer.

In an embodiment of the present disclosure, the passivation layer is provided by using a yellow light process, which includes: providing a low dielectric material layer on the second metal layer and the active layer, coating photoresist on the low dielectric material layer, exposing and developing the photoresist by using a photomask to obtain a photoresist layer, and using the photoresist layer as a barrier layer to etch the low dielectric material layer to obtain the passivation layer.

In an embodiment of the present disclosure, the low dielectric material layer is provided by a method selected from a group consisting of physical vapor deposition method, chemical vapor deposition method, coating method and evaporation method.

In an embodiment of the present disclosure, the low dielectric material layer is etched by dry etching or wet etching so as to obtain the passivation layer.

In an embodiment of the present disclosure, the passivation layer has a thickness ranging from 2,300 μm to 20,000 μm.

In the present disclosure, the passivation layer is made by a low dielectric material. Since the dielectric constant of the low dielectric material is low, the capacitance value of the overall GOA circuit can be reduced, thereby reducing the load of the gate driving circuit and reducing the power of the panel, so that the produced display panel has a higher level of energy efficiency.

BRIEF DESCRIPTION OF THE DRAWINGS

To make the technical solutions of the present invention clearer, the accompanying drawings for illustrating the embodiments of the present invention or the prior art are given briefly below. Apparently, the accompanying drawings are only for the exemplary purpose, and persons of ordinary skill in the art can derive other drawings from the accompanying drawings without creative efforts.

DETAILED DESCRIPTION

To make objectives, technical solutions and advantages of the present invention more understandable and comprehensible, the present invention is further described in detail below with reference to accompanying drawings and embodiments. It should be understood that the embodiments herein are provided for describing the present invention and not intended to limit the present invention.

It should be noted that when an element is referred to as being "fixed" to or "disposed" on another element, it may be directly or indirectly fixed to or disposed on the another element. When an element is referred to as being "connected" to another element, it may be directly or indirectly connected to the other element. Orientation or position relationships indicated by the terms such as "on", "below", "left", and "right" are based on orientation or position relationships shown in the accompanying drawings, and are used only for ease of description, rather than indicating or implying that the mentioned apparatus or component must have a particular orientation or must be constructed and operated in a particular orientation. Therefore, such terms should not be construed as limiting of this application. The terms such as "first" and "second" are used only for the purpose of description, and should not be understood as indicating or implying the relative importance or implicitly specifying the number of the indicated technical features. Unless otherwise particularly defined, "a plurality of" means two or more than two.

In order to explain the technical solutions described in the present disclosure, the following detailed description will be made in conjunction with the specific drawings and embodiments.

Figure 1:
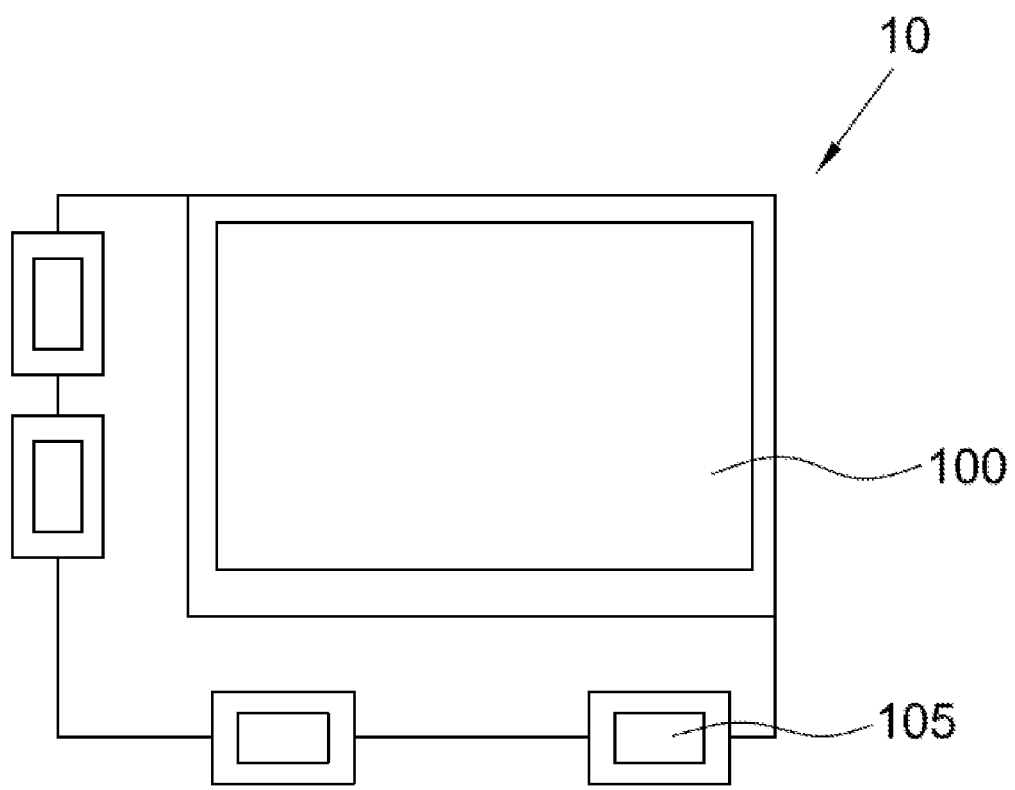
FIG. 1 is a schematic view of an exemplary display panel.

FIG. 1 is a schematic diagram of an exemplary display panel. Referring to FIG. 1, an exemplary display panel 10 includes an array substrate 100 and a driving chip 105 for driving a circuit.

Figure 2:
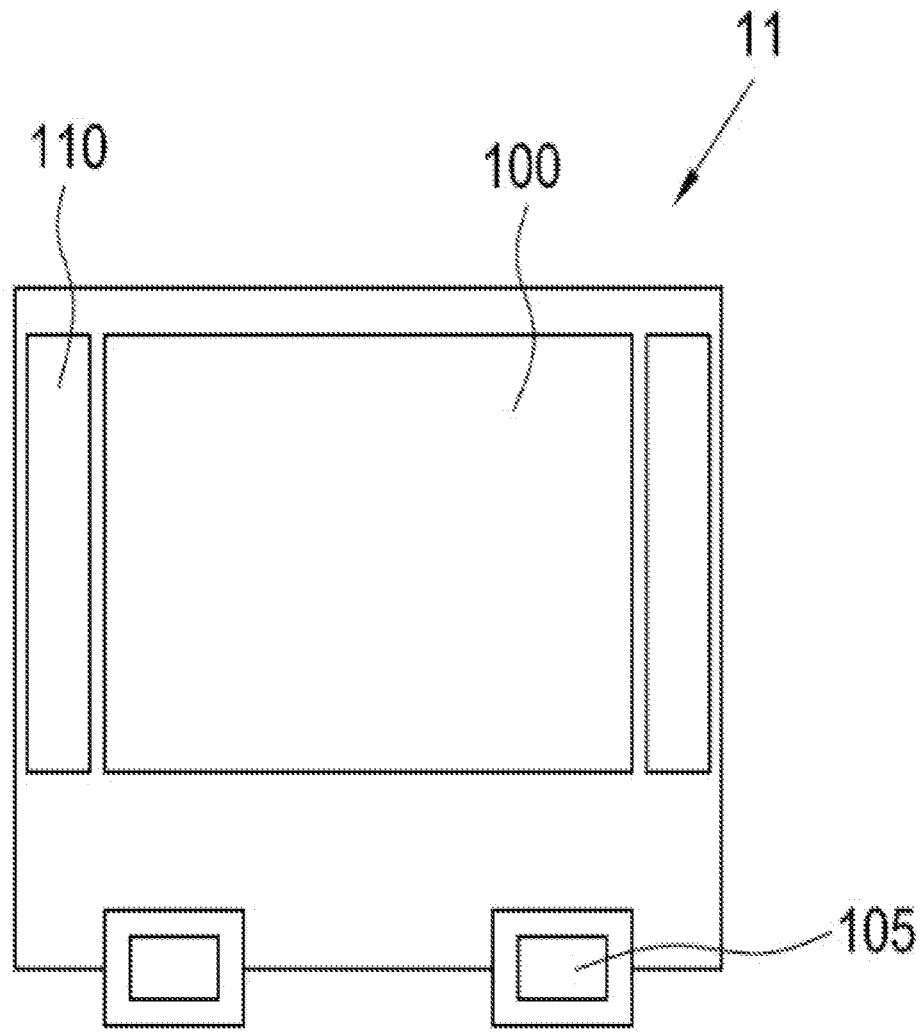
FIG. 2 is a schematic diagram of a display device according to an embodiment of the present disclosure.

FIG. 2 is a schematic diagram of a display device according to an embodiment of the present disclosure. Referring to FIG. 2, in an embodiment of the present disclosure, a display panel 11 having gate array drive includes an array substrate 100, a driving chip 105 and a gate driving circuit 110. The gate driving circuit 110 is provided on the array substrate 100. The so-called GOA is to arrange the gate driving circuit on the array substrate to replace the driving chip formed by the externally connected silicon chip. Since the GOA may be directly disposed around the panel, the production process can be simplified, the integration of the display panel can be improved, and the panel can be made thinner. With the advancement of technology, in the display panel industry a dual-drive mode GOA circuit, which is to arrange two sets of GOA circuits on both sides of the panel, has been developed.

Figure 3A:
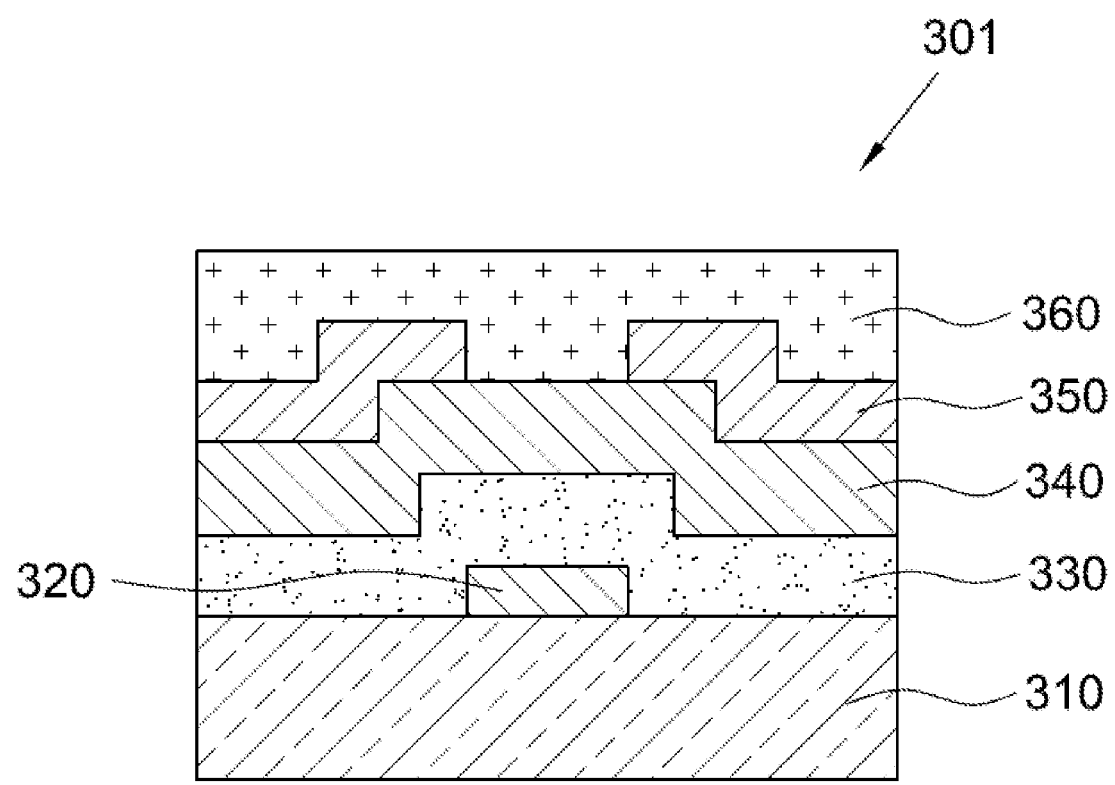
FIG. 3a is a schematic diagram of a display panel according to an embodiment of the present disclosure.
Figure 5:
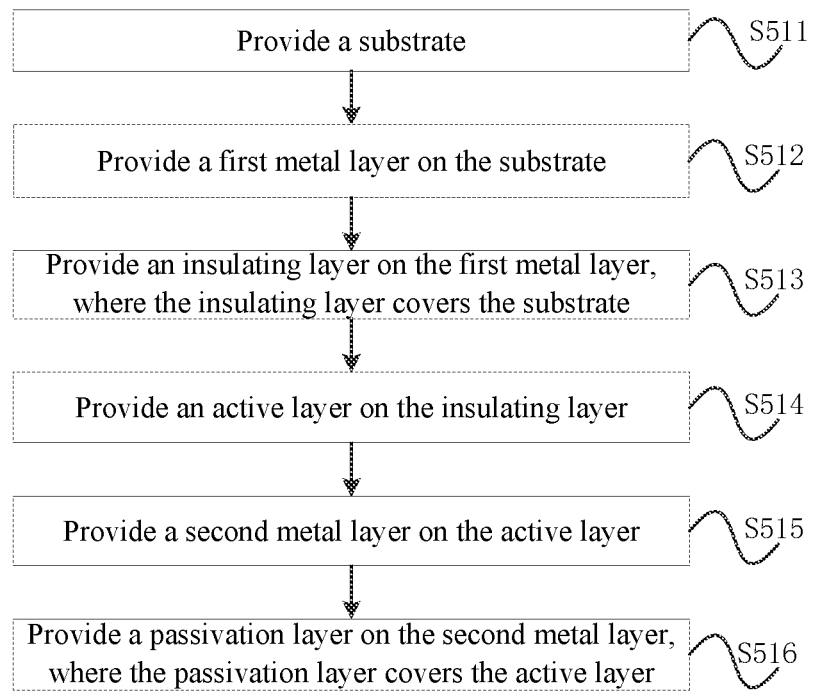
FIG. 5 is a flowchart of a method of manufacturing a display panel according to an embodiment of the present disclosure.

FIG. 3a is a schematic diagram of a display panel 301 according to an embodiment of the present disclosure. Referring to FIG. 3a and FIG. 5, a method of manufacturing a display panel includes:

providing a substrate 310;

providing a first metal layer 320 on the substrate 310;

providing an insulating layer 330 on the first metal layer 320, where the insulating layer covers the substrate 310;

providing an active layer 340 on the insulating layer 330;

providing a second metal layer 350 on the active layer 340; and providing a passivation layer 360 on the second metal layer 350, where the passivation layer covers the active layer 340;

The passivation layer 360 is provided by low dielectric material. The low dielectric material refers to a material having a dielectric constant (K) equal to or less than the dielectric constant of silicon dioxide. It is generally impossible to reduce the dielectric constant of the material without reducing the mechanical properties (elastic modulus, hardness, toughness) of the material. According to the 2001 International Technology roadmap for Semiconductor (ITRS) interconnect roadmap, the projected dielectric constant requirement for the interlevel metal insulator will be less than 2.1 for the 65 nm node, less than 1.9 for the 45 nm node, less than 1.7 for the 32 nm node and less than 1.6 for the 22 nm node. Since the dielectric constant of the low dielectric material is relatively low, the capacitance value of the overall GOA circuit can be reduced, thereby effectively reducing the load of the gate driving circuit, so that the produced display panel has a higher level of energy efficiency.

In an embodiment of the present disclosure, the low dielectric material may be pure inorganic material, pure organic material or inorganic-organic hybrid material.

Alternatively, the low dielectric material may be a ceramic material or a silica based material. Of course, depending on the actual use, the low dielectric material may alternatively be other materials.

In an embodiment of the present disclosure, the passivation layer 360 may also be doped with other materials in order to reduce the manufacturing cost. For example, the passivation layer 360 is doped with the silicon nitride material. Compared to the passivation layer of existing display panel, the material for forming the passivation layer 360 in the present disclosure includes both a low dielectric material, which can make the dielectric constant of the passivation layer 360 relatively low, thereby effectively reducing the load of the gate driving circuit, and lower cost silicon nitride materials as well, which can reduce the manufacturing cost.

In an embodiment of the present disclosure, in the method of manufacturing the display panel of the present disclosure, a parallel capacitance formula as follow is utilized:

$$C = \frac{\varepsilon_0 \times \varepsilon_r \times A}{d};$$

where $\varepsilon_0$ is the dielectric constant in vacuum, $\varepsilon_r$ is the dielectric constant of the material, A is the area of the metal layer, and the thickness of the passivation layer 360 is d, where the dielectric constant of the silicon oxide material is about 4, and the dielectric constant of the silicon nitride material is about 7. By reducing the dielectric constant of the passivation layer 360, the capacitance value of the overall GOA circuit can be reduced, thereby effectively reducing the load of the gate driving circuit, so that the display panel produced has higher energy efficiency level.

In an embodiment of the present disclosure, the thickness of the passivation layer 360 ranges from 2300 μm to 20,000 μm.

In an embodiment of the present disclosure, the active layer 340 is an amorphous silicon layer, a polysilicon layer, or a metal oxide semiconductor layer.

Optionally, when the active layer 340 is a polysilicon layer, the specific process of the active layer 340 includes: depositing an amorphous silicon layer on the insulating layer 330, crystallizing the amorphous silicon layer to obtain a polysilicon layer, ion doping the polysilicon layer, and finally performing patterning by an etching process using a photomask to obtain the active layer 340.

In an embodiment of the present disclosure, the first metal layer 320 and the second metal layer 350 may be provided by a physical vapor deposition method.

In an embodiment of the present disclosure, the material of the first metal layer 320 and the second metal layer 350 includes one or more of molybdenum, titanium, aluminum and copper.

In an embodiment of the present disclosure, the second metal layer 350 includes a source and a drain.

Figure 3B:
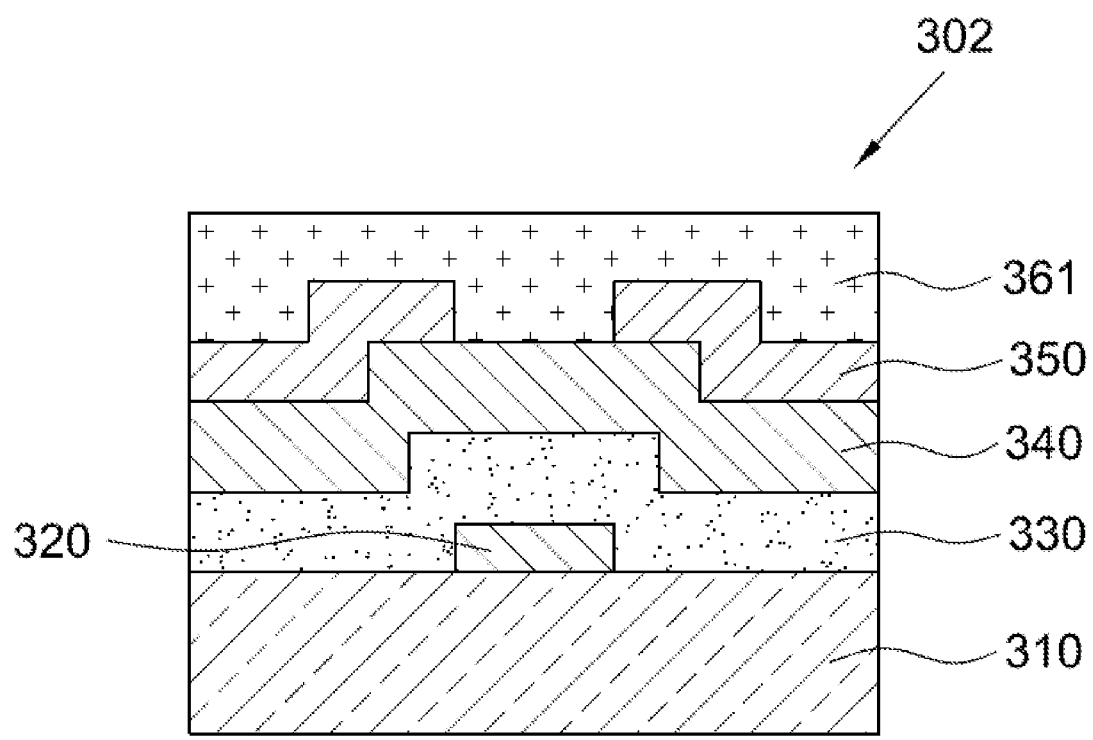
FIG. 3b is a schematic diagram of a display panel according to another embodiment of the present disclosure.

FIG. 3b is a schematic diagram of a display panel 302 according to an embodiment of the present disclosure. Referring to FIG. 3b and FIG. 5, a method of manufacturing a display panel includes:

providing a substrate 310;

providing a first metal layer 320 on the substrate 310;

providing an insulating layer 330 on the first metal layer 320, where the insulating layer covers the substrate 310;

providing an active layer 340 on the insulating layer 330;

providing a second metal layer 350 on the active layer 340; and providing a passivation layer 361 on the second metal layer 350, where the passivation layer covers the active layer 340;

The passivation layer 361 is provided by low dielectric material. The low dielectric material refers to a material having a dielectric constant (K) equal to or less than the dielectric constant of silicon dioxide. It is generally impossible to reduce the dielectric constant of the material without reducing the mechanical properties (elastic modulus, hardness, toughness) of the material. According to the 2001 International Technology roadmap for Semiconductor (ITRS) interconnect roadmap, the projected dielectric constant requirement for the interlevel metal insulator will be less than 2.1 for the 65 nm node, less than 1.9 for the 45 nm node, less than 1.7 for the 32 nm node and less than 1.6 for the 22 nm node. Since the dielectric constant of the low dielectric material is relatively low, the capacitance value of the overall GOA circuit can be reduced, thereby effectively reducing the load of the gate driving circuit, so that the produced display panel has a higher level of energy efficiency.

In an embodiment of the present disclosure, the passivation layer 361 is provided by a yellow light process, and the obtained passivation layer 361 has a high precision of the pattern, which can effectively improve the product yield.

In an embodiment of the present disclosure, the specific the step of providing the passivation layer 361 by using a yellow light process comprises: providing a low dielectric material layer on the second metal layer 350 and the active layer 340, coating photoresist on the low dielectric material layer, exposing and developing the photoresist by using a photomask to obtain a photoresist layer, and using the photoresist layer as a barrier layer to etch the low dielectric material layer to obtain the passivation layer 361.

Optionally, the low dielectric material layer is provided by a physical vapor deposition method, a chemical vapor deposition method, or coating method. Of course the low dielectric material layer may be provided by other methods, like evaporation method. And the low dielectric material layer can be etched by dry etching or wet etching so as to obtain the passivation layer 361.

In an embodiment of the present disclosure, the photomask has a light transmitting region, a non-light transmitting region, and a semi-light transmitting region. The light transmitting region, the non-light transmitting region and the semi-light transmitting region constitute the pattern of the passivation layer 361.

In an embodiment of the present disclosure, the low dielectric material may be a pure inorganic material, a pure organic material, or an inorganic-organic hybrid material.

Alternatively, the low dielectric material may be a ceramic material or a silica based material. Of course, depending on the actual use, the low dielectric material may alternatively be other materials.

In an embodiment of the present disclosure, the passivation layer 361 may also be doped with other materials in order to reduce the manufacturing cost. For example, the passivation layer 361 is doped with the silicon nitride material. Compared to the passivation layer of existing display panel, the material for forming the passivation layer 361 in the present disclosure includes both a low dielectric material, which can make the dielectric constant of the passivation layer 361 relatively low, thereby effectively reducing the load of the gate driving circuit, and lower cost silicon nitride materials as well, which can reduce the manufacturing cost.

In an embodiment of the present disclosure, in the method of manufacturing the display panel of the present disclosure, a parallel capacitance formula as follow is utilized:

$$C = \frac{\varepsilon_0 \times \varepsilon_r \times A}{d};$$

where $\varepsilon_0$ is the dielectric constant in vacuum, $\varepsilon_r$ is the dielectric constant of the material, A is the area of the metal layer, and the thickness of the passivation layer 360 is d, where the dielectric constant of the silicon oxide material is about 4, and the dielectric constant of the silicon nitride material is about 7. By reducing the dielectric constant of the passivation layer 361, the capacitance value of the overall GOA circuit can be reduced, thereby effectively reducing the load of the gate driving circuit, so that the produced display panel has a higher level of energy efficiency.

In an embodiment of the present disclosure, the thickness of the passivation layer 361 ranges from 2300 μm to 20,000 μm.

In an embodiment of the present disclosure, the active layer 340 is an amorphous silicon layer, a polysilicon layer, or a metal oxide semiconductor layer.

Optionally, when the active layer 340 is a polysilicon layer, the specific process of the active layer 340 includes: depositing an amorphous silicon layer on the insulating layer 330, crystallizing the amorphous silicon layer to obtain a polysilicon layer, ion doping the polysilicon layer, and finally performing patterning by an etching process using a photomask to obtain the active layer 340.

In an embodiment of the present disclosure, the first metal layer 320 and the second metal layer 350 may be provided by a physical vapor deposition method.

In an embodiment of the present disclosure, the material of the first metal layer 320 and the second metal layer 350 includes one or more of molybdenum, titanium, aluminum and copper.

In an embodiment of the present disclosure, the second metal layer 350 includes a source and a drain.

Figure 3C:
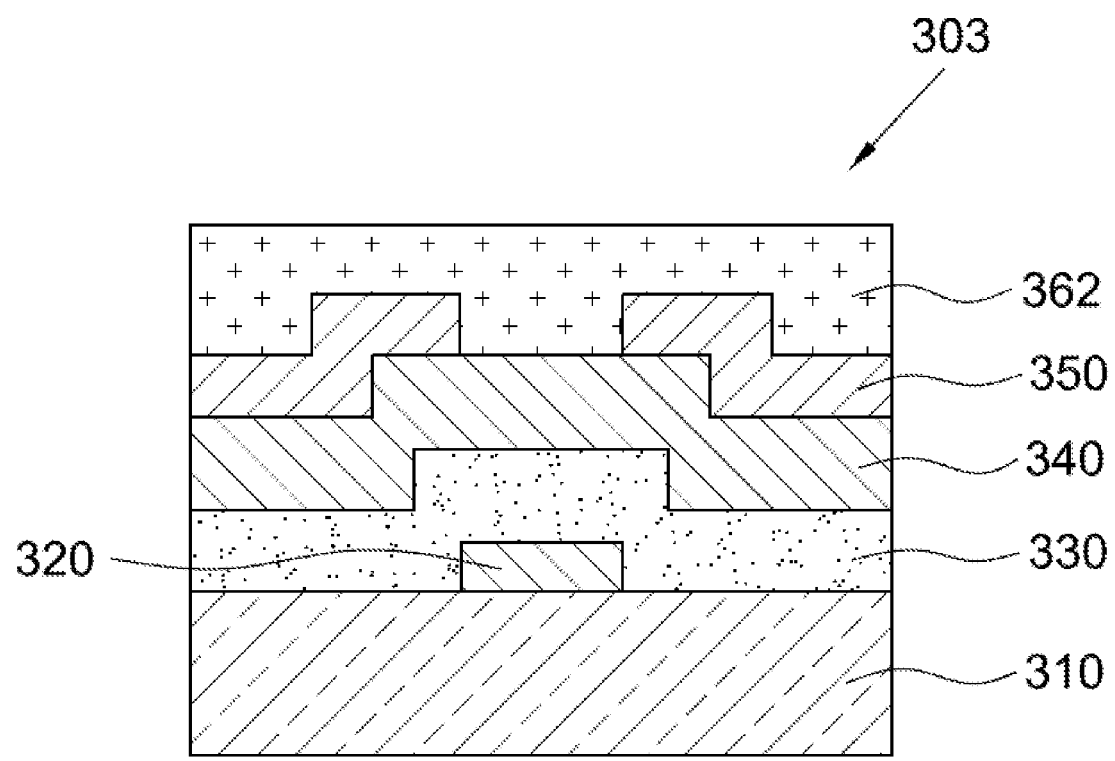
FIG. 3c is a schematic diagram of a display device according to an embodiment of the present disclosure.

FIG. 3c is a schematic diagram of a display device 303 according to an embodiment of the present disclosure. Referring to FIG. 3c, a display device includes:
 a substrate 310;
 a first metal layer 320 provided on the substrate 310;
 an insulating layer 330 provided on the first metal layer 310, where the insulating layer 330 covers the substrate 310;
 an active layer 340 provided on the insulating layer 330;
 a second metal layer 350 provided on the active layer 340; and
 a passivation layer 362 provided on the second metal layer 350, where the passivation layer 362 covers the active layer 340;

The passivation layer 362 is provided by low dielectric material. The low dielectric material refers to a material having a dielectric constant (K) equal to or less than the dielectric constant of silicon dioxide. It is generally impossible to reduce the dielectric constant of the material without reducing the mechanical properties (elastic modulus, hardness, toughness) of the material. According to the 2001 International Technology roadmap for Semiconductor (ITRS) interconnect roadmap, the projected dielectric constant requirement for the interlevel metal insulator will be less than 2.1 for the 65 nm node, less than 1.9 for the 45 nm node, less than 1.7 for the 32 nm node and less than 1.6 for the 22 nm node. Since the dielectric constant of the low dielectric material is relatively low, the capacitance value of the overall GOA circuit can be reduced, thereby effectively reducing the load of the gate driving circuit, so that the produced display panel has a higher level of energy efficiency.

In an embodiment of the present disclosure, the passivation layer 362 is provided by a yellow light process, and the obtained passivation layer 362 has a high precision of the pattern, which can effectively improve the product yield.

In an embodiment of the present disclosure, the specific the step of providing the passivation layer 362 by using a yellow light process comprises: providing a low dielectric material layer on the second metal layer 350 and the active layer 340, coating photoresist on the low dielectric material layer, exposing and developing the photoresist by using a photomask to obtain a photoresist layer, and using the photoresist layer as a barrier layer to etch the low dielectric material layer to obtain the passivation layer 362.

Optionally, the low dielectric material layer is provided by a physical vapor deposition method, a chemical vapor deposition method, or coating method. Of course the low dielectric material layer may be provided by other methods, like evaporation method. And the low dielectric material layer can be etched by dry etching or wet etching so as to obtain the passivation layer 362.

In an embodiment of the present disclosure, the photomask has a light transmitting region, a non-light transmitting region, and a semi-light transmitting region. The light transmitting region, the non-light transmitting region and the semi-light transmitting region constitute the pattern of the passivation layer 362.

In an embodiment of the present disclosure, the low dielectric material may be a pure inorganic material, a pure organic material, or an inorganic-organic hybrid material.

Alternatively, the low dielectric material may be a ceramic material or a silica based material.

In an embodiment of the present disclosure, the passivation layer 362 may also be doped with other materials in order to reduce the manufacturing cost. For example, the passivation layer 362 is doped with the silicon nitride material. Compared to the passivation layer of existing display panel, the material for providing the passivation layer 362 in the present disclosure includes both a low dielectric material, which can make the dielectric constant of the passivation layer 362 relatively low, thereby effectively reducing the load of the gate driving circuit, and lower cost silicon nitride materials as well, which can reduce the manufacturing cost.

In an embodiment of the present disclosure, in the method of manufacturing the display panel of the present disclosure, a parallel capacitance formula as follow is utilized:

$$C = \frac{\varepsilon_0 \times \varepsilon_r \times A}{d};$$

where $\varepsilon_0$ is the dielectric constant in vacuum, $\varepsilon_r$ is the dielectric constant of the material, A is the area of the metal layer, and the thickness of the passivation layer 360 is d, where the dielectric constant of the silicon oxide material is about 4, and the dielectric constant of the silicon nitride material is about 7. By reducing the dielectric constant of the passivation layer 362, the capacitance value of the overall GOA circuit can be reduced, thereby effectively reducing the load of the gate driving circuit, so that the produced display panel has a level of higher energy efficiency.

In an embodiment of the present disclosure, the thickness of the passivation layer 362 ranges from 2300 μm to 20,000 μm.

In an embodiment of the present disclosure, the active layer 340 is an amorphous silicon layer, a polysilicon layer, or a metal oxide semiconductor layer.

Optionally, when the active layer 340 is a polysilicon layer, the specific process of the active layer 340 includes: depositing an amorphous silicon layer on the insulating layer 330, crystallizing the amorphous silicon layer to obtain a polysilicon layer, ion doping the polysilicon layer, and finally performing patterning by an etching process using a photomask to obtain the active layer 340.

In an embodiment of the present disclosure, the first metal layer 320 and the second metal layer 350 may be provided by a physical vapor deposition method.

In an embodiment of the present disclosure, the material of the first metal layer 320 and the second metal layer 350 includes one or more of molybdenum, titanium, aluminum and copper.

In an embodiment of the present disclosure, the second metal layer 350 includes a source and a drain.

Figure 4:
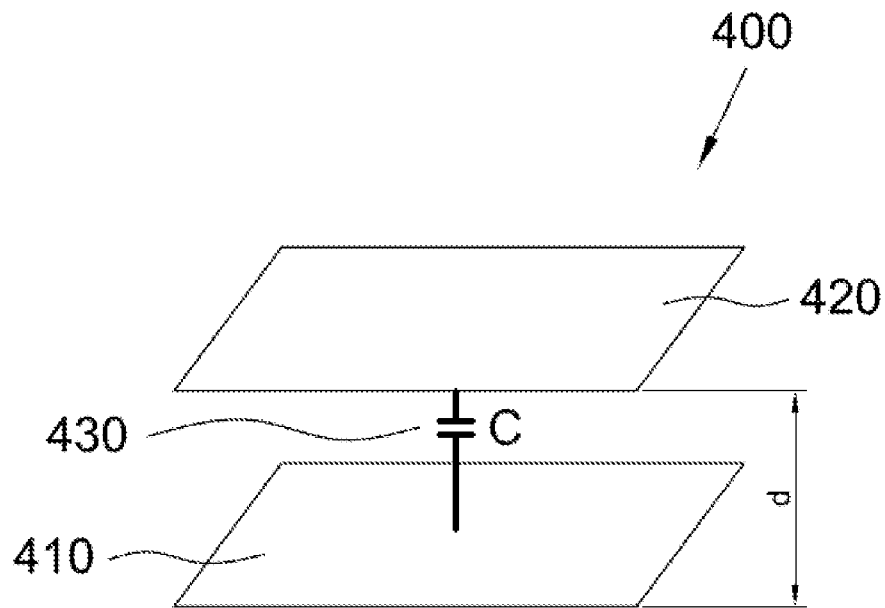
FIG. 4 is a schematic diagram of a capacitor structure with two parallel metal plates according to an embodiment of the present disclosure.

FIG. 4 is a schematic diagram of a structure of a capacitor with two parallel metal plates according to an embodiment of the present disclosure. Referring to FIG. 4, a structure 400 of a flat metal plate capacitor includes a first metal plate 410 and a second metal plate 420. And there is a spacing d between the first metal plate 410 and the second metal plate 420. A capacitor 430 is therefore generated.

In an embodiment of the present disclosure, it can be learnt that $$C = \frac{\varepsilon_0 \times \varepsilon_r \times A}{d}$$

from the parallel capacitance formula, where $\varepsilon_0$ is the dielectric constant in vacuum, $\varepsilon_r$ is the dielectric constant of the material, A is the area of the metal layer, and the thickness of the passivation layer 360 is d. Here, a passivation layer of a low dielectric material is used for the process, and a low dielectric material can reduce the dielectric constant $\varepsilon_r$ of the passivation layer, thereby effectively reducing the capacitance value of the overall GOA circuit.

In some embodiments of the present disclosure, the display panel may include an liquid crystal display (LCD) panel which includes a thin film transistor (TFT) substrate, a color filter (CF) substrate and a liquid crystal layer disposed between the two substrates, and the display panel may alternatively be an organic light-emitting diode (OLED) panel or a quantum dots light-emitting diode (QLED) panel.

In the present disclosure, the passivation layer is made by a low dielectric material. Since the dielectric constant of the low dielectric material is low, the capacitance value of the overall GOA circuit can be reduced, thereby reducing the load of the gate driving circuit and reducing the power of the panel, so that the produced display panel has a higher level of energy efficiency.

The above descriptions are merely optional embodiments of the present disclosure, and are not intended to limit this application. Any modification, equivalent replacement, or improvement made within the spirit and principle of the present application should be included within the protection scope of the present application.

What is claimed is:

1. A method of manufacturing a display panel, comprising:
   providing a substrate;
   providing a first metal layer on the substrate;
   providing an insulating layer on the first metal layer, wherein the insulating layer covers the substrate;
   providing an active layer on the insulating layer;
   providing a second metal layer on the active layer; and
   providing a passivation layer on the second metal layer,
   Wherein the passivation layer covers the active layer;
   wherein a material of the passivation layer comprises a low dielectric material, the passivation layer be doped with other materials, the low dielectric material refers to a material having a dielectric constant (K) equal to or less than the dielectric constant of silicon dioxide, wherein a parallel capacitance formula as follow is utilized:

$$C = \frac{\varepsilon_0 \times \varepsilon_r \times A}{d};$$

where $\varepsilon_0$ is a dielectric constant in vacuum, $\varepsilon_r$ is a dielectric constant of the material, A is a area of the first metal layer and the second metal layer, and a thickness of the passivation layer is d.

2. The method according to claim 1, wherein the low dielectric material is a material selected from a group consisting of pure inorganic material, pure organic material and inorganic-organic hybrid material.

3. The method according to claim 2, wherein the low dielectric material is a material selected from a group consisting of ceramic material and silica based material.

4. The method according to claim 1, Wherein the passivation layer N's a thickness ranging from 2,300 μm to 20,000 μm.

5. The method according to claim 1, Wherein the active layer is a layer selected from a group consisting of amorphous silicon layer, polysilicon layer and metal oxide semiconductor layer.

6. The method according to claim 1, wherein the passivation layer is provided by using a yellow light process.

7. The method according to claim 6, wherein the step of providing the passivation layer by using a yellow light process comprises: providing a low dielectric material layer on the second metal layer and the active layer, coating photoresist on the low dielectric material layer, exposing and developing the photoresist by using a photomask to obtain a photoresist layer, and using the photoresist layer as a barrier layer to etch the low dielectric material layer to obtain the passivation layer.

8. The method according to claim 7, wherein the low dielectric material layer is provided by a method selected from a group consisting of physical vapor deposition method, chemical vapor deposition method, coating method and evaporation method.

9. The method according to claim 7, wherein the low dielectric material layer is etched by dry etching or wet etching so as to obtain the passivation layer.

10. A method of manufacturing a display panel, comprising:
providing a substrate;
providing a first metal layer on the substrate;
providing an insulating layer on the first metal layer, wherein the insulating layer covers the substrate;
providing an active layer on the insulating layer;
providing a second metal layer on the active layer; and
providing a passivation layer on the second metal layer, wherein the passivation layer covers the active layer;
wherein a material of the passivation layer comprises a low dielectric material, the low dielectric material is, a material selected from a group consisting of ceramic material and silica based material, the passivation layer has a thickness ranging from 2,300 μm to 20,000 μm, the active layer is a layer selected from a group consisting of amorphous silicon layer, polysilicon layer and metal oxide semiconductor layer, the passivation layer is provided by using a yellow light process which comprises: providing a low dielectric material layer on the second metal layer and the active layer by a method selected from a group consisting of physical vapor deposition method, chemical vapor deposition method, coating method and evaporation method, coating photoresist on the low dielectric material layer, exposing and developing the photoresist by using a photomask to obtain a photoresist layer, and using the photoresist layer as a barrier layer to etch the low dielectric material layer by dry etching or wet etching to obtain the passivation layer, the passivation layer be doped with other materials, the low dielectric material refers to a material having a dielectric constant (K) equal to or less than the dielectric constant of silicon dioxide, wherein a parallel capacitance formula as follow is utilized:

$$C = \frac{\varepsilon_0 \times \varepsilon_r \times A}{d};$$

where $\varepsilon_0$ is a dielectric constant in vacuum, $\varepsilon_r$ is a dielectric constant of the material, A is a area of the first metal layer and the second metal layer, and a thickness of the passivation layer is d.

11. A display device, comprising:
a substrate;
a first metal layer provided on the substrate;
an insulating layer provided on the first metal layer, wherein the insulating layer covers the substrate;
an active layer provided on the insulating layer;
a second metal layer provided on the active layer; and
a passivation layer provided on the second metal layer, wherein the passivation layer covers the active layer;
wherein a material of the passivation layer comprises a low dielectric material, the passivation layer be doped with other materials, the low dielectric material refers to a material having a dielectric constant (K) equal to or less than the dielectric constant of silicon dioxide, wherein a parallel capacitance formula as follow is utilized:

$$C = \frac{\varepsilon_0 \times \varepsilon_r \times A}{d};$$

where $\varepsilon_0$ is a dielectric constant in vacuum, $\varepsilon_r$ is a dielectric constant of the material, A is a area of the first metal layer and the second metal layer, and a thickness of the passivation layer is d.

12. The display device according to claim 11, wherein the low dielectric material is a material selected from a group consisting of pure inorganic material, pure organic material and inorganic-organic hybrid material.

13. The display device according to claim 12, Wherein the low dielectric material is a material selected from a group consisting of ceramic material and silica based material.

14. The display device as claimed in claim 11, wherein the passivation layer is provided by using a yellow light process, which comprises: providing a low dielectric material layer on the second metal layer and the active layer, coating photoresist on the low dielectric material layer, exposing and developing the photoresist by using a photomask to obtain a photoresist layer, and using the photoresist layer as a barrier layer to etch the low dielectric material layer to Obtain the passivation layer.

15. The display device according to claim 14, wherein the low dielectric material layer is provided by a method selected from a group consisting of physical vapor deposition method, chemical vapor deposition method, coating method and evaporation method.

16. The display device according to claim 14, wherein the low dielectric material layer is etched by dry etching or wet etching so as to obtain the passivation layer.

17. The display device according to claim 14, wherein the passivation layer has a thickness ranging from 2,300 μm to 20,000 μm.

* * * * *